United States Patent [19]
Ooms et al.

[11] Patent Number: 5,874,755
[45] Date of Patent: *Feb. 23, 1999

[54] FERROELECTRIC SEMICONDUCTOR DEVICE AND METHOD OF MANUFACTURE

[75] Inventors: William J. Ooms, Chandler; Jerald A. Hallmark, Gilbert; Daniel S. Marshall, Chandler, all of Ariz.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 743,768

[22] Filed: Nov. 7, 1996

[51] Int. Cl.⁶ ................................................. H01L 29/78
[52] U.S. Cl. ........................................... 257/295; 257/314
[58] Field of Search ..................... 257/295, 314

[56] References Cited

U.S. PATENT DOCUMENTS

| | | | |
|---|---|---|---|
| 4,047,214 | 9/1977 | Francombe et al. | 257/314 |
| 4,161,038 | 7/1979 | Wu | 257/295 |
| 5,654,568 | 8/1997 | Nakao | 257/295 |

*Primary Examiner*—Gene M. Munson
*Attorney, Agent, or Firm*—Rennie William Dover; Robert D. Atkins; Lanny L. Parker

[57] ABSTRACT

A ferroelectric semiconductor device (10) and a method of manufacturing the ferroelectric semiconductor device (10). The ferroelectric semiconductor device (10) has a layer (13) of ferroelectric material disposed on a semiconductor substrate (11) and a gate electrode (17) formed on a portion (26) of the layer (13) of ferroelectric material. The portion (26) of the layer (13) of ferroelectric material sandwiched between a semiconductor substrate (11) and a gate electrode (17) retains its ferroelectric activity. The portions (21, 22) of the layer (13) of ferroelectric material adjacent the portion (26) are damaged and thereby rendered ferroelectrically inactive. A source contact (31) and a drain contact (32) are formed through the damaged portions (21, 22) of the layer (13) of ferroelectric material.

15 Claims, 1 Drawing Sheet

FERROELECTRIC SEMICONDUCTOR DEVICE AND METHOD OF MANUFACTURE

BACKGROUND OF THE INVENTION

The present invention relates, in general, to semiconductor devices, and more particularly, to ferroelectric semiconductor devices.

Ferroelectric materials have been used to form electrical components such as non-volatile memories, capacitors, and optical guided wave devices. For example, in non-volatile semiconductor devices a ferroelectric material is deposited on a substrate oxide overlying a semiconductor substrate. Then, a gate material is deposited on the ferroelectric material. The gate material and the ferroelectric material are etched to form a gate structure. A drawback in the manufacture of these types of semiconductor devices is that formation of the gate structure causes defects along the edges of the gate structure. These defects degrade the electrical properties of the ferroelectric material.

Accordingly, it would be advantageous to have a ferroelectric device and a method for manufacturing the ferroelectric device that does not degrade the electrical properties of the ferroelectric material.

DETAILED DESCRIPTION OF THE DRAWINGS

Generally, the present invention provides a ferroelectric device and a method for manufacturing the ferroelectric device without degrading the ferroelectric properties of the ferroelectric device. In accordance with one aspect of the present invention, the ferroelectric properties of a ferroelectric material are degraded in selected regions of the ferroelectric material by implanting ions into the ferroelectric material. In accordance with another aspect of the present invention, the ferroelectric properties of a ferroelectric material are degraded in selected regions of the ferroelectric material by exposing the ferroelectric material to a reactive ion etch. In accordance with yet another aspect of the present invention, the ferroelectric properties of the ferroelectric material are degraded in selected regions by exposing the ferroelectric material to hydrogen.

Figure 1:
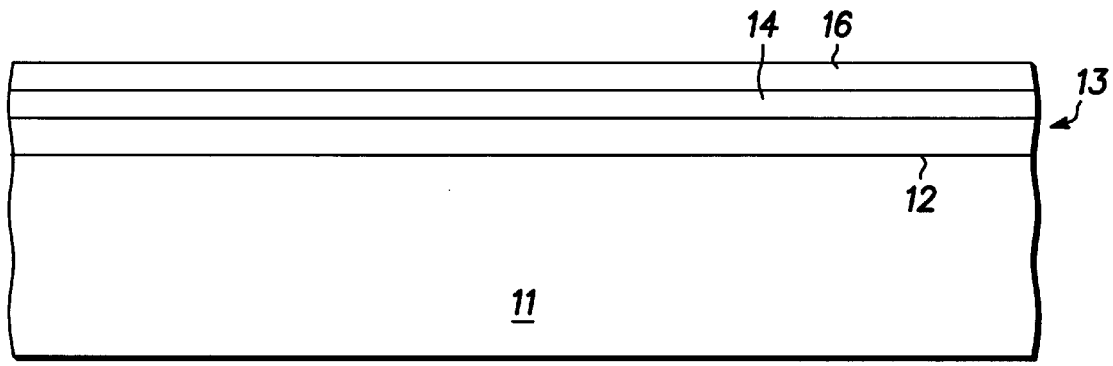
FIG. 1 is a cross-sectional view of a portion of a ferroelectric semiconductor device at an early stage of manufacture in accordance with the present invention.

FIG. 1 is a cross-sectional view of a portion of a ferroelectric semiconductor device 10 at an early stage of manufacture in accordance with the present invention. Ferroelectric semiconductor device 10 includes a monocrystalline semiconductor material or substrate 11 having a major surface 12 with a layer 13 of ferroelectric material formed thereon. Suitable semiconductor materials for substrate 11 include silicon, epitaxially grown silicon, gallium arsenide, indium phosphide, or the like. By way of example, semiconductor substrate 11 is silicon having a <001> surface orientation and ferroelectric layer 13 is epitaxially formed on semiconductor substrate 11. Epitaxial films of ferroelectric material may be formed using an ultra high vacuum deposition system such as, for example, molecular beam epitaxy or chemical beam epitaxy, or a low pressure metalloorganic chemical vapor deposition system. Suitable ferroelectric materials for the ferroelectric layer 13 include barium titanate ($BaTiO_3$) and other perovskites, as well as layered bismuth ferroelectrics such as bismuth titanate ($Bi_4Ti_3O_{12}$) and bismuth strontium tantalate ($SrBi_2Ta_2O_9$), and other ferroelectrics such as yttrium manganate ($YMnO_3$), or the like.

The use of an ultra high vacuum deposition system is a means of preventing undesired elements from destroying the electronic properties at the interface between silicon substrate 11 and ferroelectric layer 13. In accordance with one embodiment of the present invention, a monocrystalline layer of ferroelectric material is formed in intimate contact with the semiconductor substrate. Further, ferroelectric layer 13 has a lattice constant substantially matching that of semiconductor substrate 11. Epitaxial formation of ferroelectric layer 13 prevents undesired material such as, for example, an undesired oxide or contaminants from appearing at the interface between semiconductor substrate 11 and ferroelectric layer 13. Although epitaxial formation of ferroelectric material is advantageous, it should be understood that the method of forming the layer of ferroelectric material is not a limitation of the present invention.

Still referring to FIG. 1, a layer 14 of conductive material is formed on ferroelectric layer 13. By way of example, layer 14 of conductive material is polysilicon. A layer 16 of photoresist is formed on conductive layer 14. Techniques for forming layers of conductive material and photoresist are known to those skilled in the art.

Figure 2:
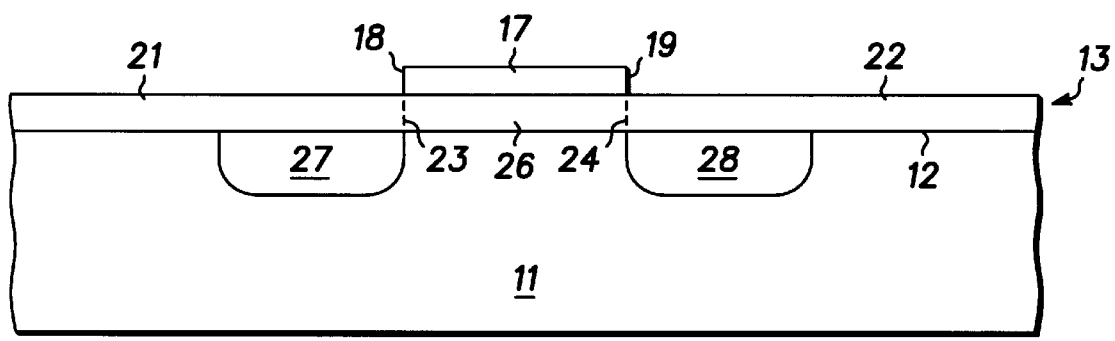
FIG. 2 is a cross-sectional view of the semiconductor device of FIG. 1 further along in processing.

FIG. 2 is a cross-sectional view of ferroelectric semiconductor device 10 further along in processing. It should be noted that the same reference numbers are used in the figures to denote the same elements. Photoresist layer 16 is patterned to expose portions of conductive layer 14, i.e., photoresist layer 16 forms an etch mask. A gate electrode 17 having edges or sides 18 and 19 is formed by removing the portions of conductive layer 14 unprotected by the etch mask. By way of example, gate electrode 17 is formed using a reactive ion etch (RIE)Gate electrode 17 is comprised of the remaining portion of conductive layer 14. The remaining portions of photoresist layer 16 are removed.

In accordance with the first aspect of the present invention, a blanket ion implant is performed to disrupt the ferroelectric properties of portions 21 and 22 of ferroelectric layer 13 that are unprotected by gate electrode 17. By way of example, the ferroelectric properties of portions 21 and 22 are disrupted by implanting phosphorus ions into portions 21 and 22 of ferroelectric layer 13; however, the dielectric properties of ferroelectric layer 13 are maintained. It should be noted that broken lines 23 and 24 extending from edges 18 and 19, respectively, are included to indicate the approximate lateral boundaries of portions 21 and 22. It should be further noted that a portion 26 of ferroelectric layer 13 between semiconductor material 11 and gate electrode 17 retains its ferroelectric properties. Thus, the regions of ferroelectric activity are patterned by implanting ions into the portions ferroelectric layer 13 which are to become ferroelectrically inactive, whereas the remaining portions of ferroelectric layer 13 remain ferroelectrically active.

In accordance with another aspect of the present invention, the ferroelectric properties of portions 21 and 22 may be degraded by etching them with a reactive ion etch. In accordance with yet another aspect of the present invention, the ferroelectric properties of portions 21 and 22 may be degraded by exposing them to a hydrogen ambient. It should be noted that the technique for damaging the ferroelectric material is not a limitation of the present invention. Damaging the ferroelectric material is also referred to as rendering the damaged portions of the ferroelectric material inactive.

An implant mask (not shown) is formed on ferroelectric layer 13. Techniques for forming implant masks are well known to those skilled in the art. An impurity material of N conductivity type such as, for example, phosphorus is implanted through portions 21 and 22 and into the regions of silicon substrate 11 underlying portions 21 and 22 to form doped regions 27 and 28, respectively. Doped regions 27 and 28 serve as the respective source and drain regions of ferroelectric semiconductor device 10. Although source and drain regions 27 and 28, respectively, are shown as being self-aligned to gate electrode 17, this is not a limitation of the present invention. The implant mask is removed using techniques known to those skilled in the art.

Figure 3:
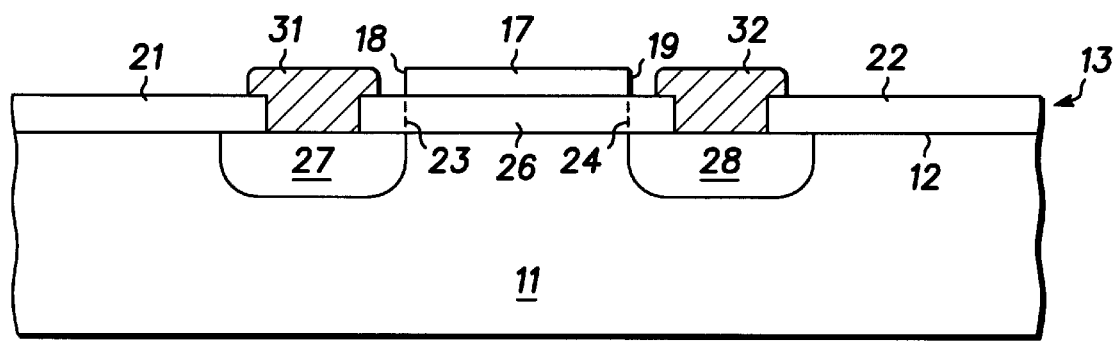
FIG. 3 is a cross-sectional view of the semiconductor device of FIG. 2 further along in processing.

Now referring to FIG. 3, openings (not shown) are formed in portions 21 and 22 of ferroelectric layer 13 to expose portions of major surface 12. Source and drain contacts 31 and 32, respectively, are formed to contact the exposed portions of major surface 12.

It should be noted the present invention is suitable for forming N and P channel enhancement mode field effect transistors and N and P channel depletion mode field effect transistors. Thus, the source/drain regions can be formed using an impurity material of P conductivity type such as, for example, boron.

By now it should be appreciated that ferroelectric transistor structures and a method for forming the ferroelectric transistor structures have been provided. The ferroelectric transistor structure is comprised of a ferroelectric material that is patterned to have areas or regions of ferroelectric activity and regions that are rendered ferroelectrically inactive. An advantage of the method and structure of the present invention is that selected portions of the ferroelectric material are protected from damage by, for example, reactive ion etch techniques. Thus, the present invention permits manufacturing small geometry semiconductor devices.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, the substrate material may be comprised of a layer of silicon dioxide sandwiched between silicon substrate 11 and ferroelectric layer 13. Further, the ferroelectric material may be damaged simultaneously with formation of the source and drain regions. In other words, the implant used to form doped regions 27 and 28, i.e., the source and drain regions, respectively, can be used to simultaneously damage the ferroelectric material rather than using two separate steps to damage the ferroelectric material.

We claim:

1. A ferroelectric semiconductor device, comprising:

a semiconductor material of a first conductivity type;

a ferroelectric material over the semiconductor material, wherein the ferroelectric material has a first ferroelectric portion and further has a second ferroelectric portion rendered inactive by lattice damage to the ferroelectric material;

a conductive material over the first ferroelectric portion; and first and second doped regions disposed in the semiconductor material on opposing sides of the conductive material.

2. The ferroelectric semiconductor device of claim 1, wherein the ferroelectric material is bismuth titanate.

3. The ferroelectric semiconductor device of claim 1, wherein the lattice damage to the second ferroelectric portion is from a reactive ion etch.

4. The ferroelectric semiconductor device of claim 1, wherein the lattice damage to the second ferroelectric portion is from hydrogen.

5. The ferroelectric semiconductor device of claim 1, wherein the lattice damage to the second ferroelectric portion is from ion implantation.

6. A ferroelectric semiconductor device, comprising:

a semiconductor material;

a ferroelectric material over the semiconductor material having an active ferroelectric portion and an inactive ferroelectric portion that is rendered inactive through lattice damage;

a conductive material over the active ferroelectric portion; and first and second doped regions disposed in the semiconductor material on opposing sides of the conductive material.

7. The ferroelectric semiconductor device of claim 6, wherein the ferroelectric material is bismuth titanate.

8. The ferroelectric semiconductor device of claim 6, wherein the lattice damage to the inactive ferroelectric portion is from a reactive ion etch.

9. The ferroelectric semiconductor device of claim 6, wherein the lattice damage to the inactive ferroelectric portion is from hydrogen.

10. The ferroelectric semiconductor device of claim 6, wherein the lattice damage to the inactive ferroelectric portion is from ion implantation.

11. A ferroelectric transistor having first and second doped regions separated by a channel, comprising:

a first ferroelectric material disposed over the channel;

a conductive material disposed over the first ferroelectric material; and a second ferroelectric material that has been rendered inactive by lattice damage disposed over a portion of the first doped region.

12. The ferroelectric semiconductor device of claim 11, wherein the ferroelectric material is bismuth titanate.

13. The ferroelectric semiconductor device of claim 11, wherein the lattice damage to the second ferroelectric portion is from a reactive ion etch.

14. The ferroelectric semiconductor device of claim 11, wherein the lattice damage to the second ferroelectric portion is from hydrogen.

15. The ferroelectric semiconductor device of claim 11, wherein the lattice damage to the second ferroelectric portion is from ion implantation.

* * * * *